US011245331B2

United States Patent
Wang et al.

(10) Patent No.: US 11,245,331 B2
(45) Date of Patent: Feb. 8, 2022

(54) TWO-TERMINAL ACTIVE CAPACITOR DEVICE

(71) Applicant: AALBORG UNIVERSITET, Aalborg Øst (DK)

(72) Inventors: Huai Wang, Aalborg (DK); Haoran Wang, Aalborg Ø (DK); Frede Blaabjerg, Aalborg (DK)

(73) Assignee: Aalborg Universitet

(*) Notice: Subject to any disclaimer, the term of this patent is extended or adjusted under 35 U.S.C. 154(b) by 0 days.

(21) Appl. No.: 16/971,710

(22) PCT Filed: Feb. 21, 2019

(86) PCT No.: PCT/DK2019/050063
§ 371 (c)(1),
(2) Date: Aug. 21, 2020

(87) PCT Pub. No.: WO2019/161866
PCT Pub. Date: Aug. 29, 2019

(65) Prior Publication Data
US 2020/0395850 A1    Dec. 17, 2020

(30) Foreign Application Priority Data
Feb. 22, 2018    (DK) .......................... PA 2018 70114

(51) Int. Cl.
*H02M 3/158*    (2006.01)
*G06F 1/26*    (2006.01)
(Continued)

(52) U.S. Cl.
CPC ............ *H02M 3/158* (2013.01); *G06F 1/266* (2013.01); *H02M 7/003* (2013.01); *H02M 7/5387* (2013.01)

(58) Field of Classification Search
CPC .......... H02M 3/158; H02M 3/22; H02M 3/24; H02M 7/003; H02M 3/157; H02M 7/04;
(Continued)

(56) References Cited

U.S. PATENT DOCUMENTS 7,656,255 B2    2/2010 Abel et al.
8,542,052 B2    9/2013 Halberstadt
(Continued)

FOREIGN PATENT DOCUMENTS

EP    2424094 A2    2/2012

OTHER PUBLICATIONS

Wang et al.,"A Voltage Control Method for an Active Capacitive DC-link Module with Series-Connected Circuit", Center of Reliable Power Electronics (CORPE), Department of Energy Technology, Aalborg University, Denmark, IEEE, XP033129922, 2017, pp. 221-225.
(Continued)

*Primary Examiner* — Hai L Nguyen
(74) *Attorney, Agent, or Firm* — BakerHostetler (57) ABSTRACT

An active two-terminal capacitor device with a controllable capacitance based on a capacitance value input C_I. A processor system PRS executes an algorithm which controls a power converter PCV with controllable electric switches connected to the two external terminals A, B along with a fixed value capacitor component CI. Based on sampling of at least the voltage across the capacitor component CI, the algorithm controls the power converter PCV to provide a resulting capacitance across the external terminals A, B which serves to match the capacitance value in ut C_I.

26 Claims, 9 Drawing Sheets

(51) Int. Cl.
   *H02M 7/00* (2006.01)
   *H02M 7/5387* (2007.01)
(58) Field of Classification Search
   CPC .. H02M 7/44; H02M 7/5387; H02M 7/53871; G06F 1/26
   See application file for complete search history.

(56) References Cited

U.S. PATENT DOCUMENTS

| | | | |
|---|---|---|---|
| 9,294,053 | B2 | 3/2016 | Endou et al. |
| 9,912,247 | B2 * | 3/2018 | Chung .................... H02M 5/42 |
| 2014/0347896 | A1 | 11/2014 | Chung et al. |

OTHER PUBLICATIONS

Wang et al., "Impedance Characteristics Modeling of a Two-Terminal Active Capacitor", Department of Energy Technology, Aalborg University, Denmark, IEEE, XP033144025, 2017 pp. 1-7.

Funato et al., Proposal of Variable Active-Passive Reactance Department of Electrical and Computer Engineering, Yokohama National University, IEEE, XP010060666, 1992, pp. 381-388.

Wang et al., "A Two-Terminal Active Capacitor", IEEE Transactions on Power Electronics, vol. 32, No. 8, Aug. 2017, pp. 5893-5896.

International Search Report and Written Opinion issued in PCT/DK2019/050063, dated Jun. 21, 2019.

International Patent Application No. PCT/DK2019/050064; Int'l Search Report and the Written Opinion; dated Jun. 21, 2019; 18 pages.

"Duality", Slideshow, found on https://filebox.ece.vt.edu/~LiaB/Lectures/Ch 8/; Retrieved on Sep. 12, 2017; 8 pages.

Davari et al.; "A Review of Electronic Inductor Technique for Power Factor Correction in Three-Phase Adjustable Speed Drives"; Dept. of Energy Technology, Aalborg University, Denmark; IEEE; 2016; 8 pages.

Rana et al.; "Analysis and Design of Active Inductor as DC-Link Reactor for Lightweight Adjustable Speed Drive Systems"; Power Electronics & Power Quality Laboratory; Texas A&M University, USA; IEEE; XP032681079; 2014; p. 3243-3250.

Li et al.; "A General Approach to Programmable and Reconfigurable Emulation of Power Impedances"; IEEE Transactions on Power Electronics; vol. 33 No. 1; XP011662035; Jan. 2018; p. 259-271.

* cited by examiner

TWO-TERMINAL ACTIVE CAPACITOR DEVICE

CROSS-REFERENCE TO RELATED APPLICATIONS

This application is the National Stage of International Patent Application No. PCT/DK2019/050063, "A Two-Terminal Active Capacitor Device" (filed Feb. 21, 2019), which claims priority to Danish Patent Application No. PA 2018 70114 (filed Feb. 22, 2018). The foregoing applications are incorporated herein by reference in their entireties for any and all purposes.

FIELD OF THE INVENTION

The present invention relates to the field of power electric systems or power electronic systems, more specifically the invention provides a two-terminal active capacitor device for use in power electric systems, e.g. converters. The device can be made compact compared to a traditional capacitor component with the same electric capacitance, and the capacitance value may be programmable.

BACKGROUND OF THE INVENTION

Capacitors are in general key components in power electric systems in terms of cost, volume, and long term reliability. Capacitors are used in switching circuits such as DC-DC, AC-DC, DC-AC converters, DC-link applications, online damping for stability, adaptive energy buffering etc.

Especially, high capacitance electrolytic capacitors often used in power (e.g. 10 W to several MW) electric systems are expensive, bulky, and they are known to change their capacitance over time (years).

Furthermore, in the manufacturing process, each fixed capacitance value needs its own manufacturing process line. Adjustable capacitors are known, but such components are rare in case of high capacitance values.

SUMMARY OF THE INVENTION

Thus, according to the above description, it is an objective of the present invention to provide a compact and low cost capacitor device with the capability to provide a high capacitance which is adjustable according to a capacitance value input. Further, the device should preferably be capable of being used in a wide range of applications at different electric power from low power to high power applications.

In a first aspect, the invention provides a capacitor device with a controllable electric capacitance value input, comprising
  an enclosure,
  a power converter comprising a plurality of interconnected controllable electric switches,
  a first capacitor component with a fixed capacitance, and being electrically connected to the power converter,
  two external electric terminals arranged to be externally accessible from outside the enclosure, wherein at least one of the two external electric terminals are connected to the first capacitor component and the power converter, and
  a processor system arranged to sense at least one input voltage related to one of the two external electric terminals and the first capacitor component and to process the sensed at least one input voltage according to an algorithm configured to control the power converter, so as to provide a resulting electric capacitance between the two external electric terminals which corresponds to the controllable electric capacitance value input.

Such capacitor device is advantageous, since it can be seen as an active capacitor with an adjustable capacitance value, especially in embodiments with a self-powering circuit. Still it can be provided in a two-terminal package, thus being easy to incorporate in existing power circuits as a replacement for a traditional capacitor component with a fixed capacitance. Especially, the two external electric terminals may be arranged with the same mutual distance as existing passive capacitor components, thus facilitating replacement of existing components without further changes. The invention is applicable for low power applications, e.g. LED driver electronics, and also high power applications in the range of kW or MW.

The fact that the capacitance value is controlled by a processor system means, that a high capacitance can be obtained within an enclosure with compact dimensions compared with a traditional passive capacitor component with the same capacitance. Furthermore, the processor controlled capacitance means that it is possible to maintain the same capacitance over a long time, e.g. +10 or +20 years even in spite of the first capacitor component changing its capacitance as a function of time.

Furthermore, the capacitor device is suitable also for high power applications, since it is possible to implement with switching circuit topologies with a minimum of power loss.

Even further, the capacitor device can be configured to allow on-line adjustment of the resulting capacitance in response to a voltage across the two external electric terminals. E.g. the adjustable capacitance value input may be a nominal capacitance value, if the observed voltage is within a threshold value, whereas the resulting capacitance can be determined in response to the voltage, in case the voltage is outside the threshold value. Hereby, it is possible to provide a resulting capacitance with is responsive to the operating condition, e.g. load or impedance matching, of the application in which the capacitor device is applied. This may allow increased efficiency of power electric applications which is not possible with a capacitor component having a fixed capacitance.

In the following, preferred features and embodiments will be described.

Especially, the algorithm is configured to provide a resulting capacitance being at least a factor of 2 times, e.g. at least a factor of 5 times, e.g. at least a factor of 10 times, the fixed capacitance of the first capacitor component.

The processor system may be implemented with a digital processor, e.g. a digital microcontroller, or the algorithm may be implemented as an analog controller by means of an analog electronic circuit. In the case of a digital processor, the processor system may comprise
  a sampling circuit arranged to sample said sensed at least one input voltage and to generate a digital signal output accordingly,
  a digital processor configured to execute an algorithm stored in a memory, which algorithm is configured to generate a control signal to control the power converter in response to the digital signal output from the sampling circuit, so as to provide said resulting electric capacitance between the two external electric terminals, and
  a gate driver circuit arranged to control the plurality of controllable electric switches in response to the control signal from the processor.

Preferably, the enclosure is configured for housing the first capacitor component, the power converter, as well as the processor system, e.g. the enclosure being a box-shaped enclosure, e.g. a polymeric or metallic enclosure, with both of the two external electric terminals being arranged on one side, or being arranged on respective sides of the enclosure. Especially, the enclosure further houses a self-powering circuit and/or a battery. Hereby, a two-terminal active capacitor device is provided which, from the outside, is similar to a traditional passive capacitor component. At least the enclosure preferably serves to provide electric isolation.

In embodiments, the power converter and the processor system may be arranged inside a resin or a gel and positioned within a housing of the first capacitor component. Hereby, a capacitor device can be obtained with an increased capacitance compared to the capacitance of the first capacitor component, and still sharing the same enclosure as the first capacitor component.

Preferably, the capacitor device comprises a self powering circuit connected to receive electric power from the two external electric terminals in a direct or indirect manner, and to convert said electric power for powering the power converter, and the processor system. Hereby, the capacitor device can function as a traditional two-terminal capacitor component without additional inputs necessary. In some applications, a battery may be used to provide the necessary power instead or in addition to the self powering circuit.

The processor system, the power converter, and the first capacitor component may be arranged on one single Printed Circuit Board (PCB), thereby providing a compact element for fitting inside a compact enclosure.

The capacitor device may be arranged to receive the controllable electric capacitance value input in a large variety of different ways, depending on the preferred application. In some embodiments, the controllable electric capacitance value input is provided as a pre-stored value in the algorithm stored in the memory, wherein the capacitance value input is provided one time only during manufacturing of the capacitor device. In other embodiments, the capacitance value input can be provided in the form of an input during normal operation of the capacitor device.

In preferred embodiments, the capacitor device is configured to receive the controllable electric capacitance value input into said memory. Especially, said algorithm may involve an adjustable factor or coefficient which is adjustable in response to the capacitance value input. Thus, hereby the resulting capacitance value can be programmed into the memory in which the algorithm is stored. Especially, a predetermined relation between said factor or coefficient and the resulting capacitance value may be stored in memory, so as to allow conversion of a capacitance value input and said factor or coefficient.

Especially, the capacitor device may be configured to receive the controllable electric capacitance value input into said memory from outside the enclosure, e.g. by means of at least one externally accessible electric terminal, and/or by means of a wireless interface. This allows the capacitance value input to be entered after manufacturing of the capacitor device, e.g. during normal operation of the capacitor device. Thus, one capacitor device hardware can be used for different capacitance values. E.g. such wireless interface can be obtained with a processor based on a digital microprocessor such as MCU CC430™ or CC2640™ facilitating a 1 GHz radio interface, which allows external programming of the algorithm, and thus also wireless entering the capacitance value input, during manufacturing, or by a user during normal operation of the capacitor device.

Alternatively, the capacitor device may be configured to receive the controllable electric capacitance value input by means of a pre-programmed Read Only Memory (ROM) type memory which at least contains a preprogrammed code indicative of the controllable electric capacitance value input. This allow pre-programming of the capacitance value input, e.g. to allow pre-manufacturing of an element comprising the processor, power converter, and the first capacitor, where the ROM memory can be selected to determine the resulting capacitance of the capacitor device in the final manufacturing step.

In some embodiments, the capacitor device is configured to receive the controllable electric capacitance value input by means of an adjustable device, e.g. a potentiometer or the like, with a plurality of different settings which can be read by the processor. Especially, the adjustable device can be mounted on the same PCB on which at least the processor system is mounted. Such adjustable device allows manufacturing of one capacitor device hardware, which can then manually be adjusted, e.g. by a user, to provide a specific resulting capacitance.

In some embodiments, the sampling circuit is arranged to sample a voltage, e.g. a voltage across the two external electric terminals or a voltage across the first capacitor component, and to generate a digital feedback signal to the processor accordingly, wherein said algorithm is arranged to adjust the resulting electric capacitance value in response to said digital feedback signal. Hereby, the resulting capacitance of the capacitor device can be varied on-line, e.g. in response to operation conditions of the circuit in which the capacitor device is connected. This can be used to improve efficiency of certain power electric applications.

Especially, the capacitor component may be an electrolytic type capacitor, e.g. with a fixed capacitance of at least 1 µF, or such as with a fixed capacitance of at least 10 µF. As alternatives, the capacitor component may be a film or ceramic type of capacitor, but still other alternatives are possible.

Especially, the plurality of controllable electric switches of the power converter may be connected in a full bridge configuration, e.g. comprising 4 controllable electric switches in an H bridge configuration. Especially, the controllable electric switches may comprise insulated gate bipolar transistors (IGBTs), and/or controllable electric switches formed by: mosfet, GTO, IGCT, and/or comprises power electronic switches based on silicon carbide (SiC) or Gallium Nitride (GaN) technologies.

The power converter preferably comprises a second capacitor component with a fixed capacitance. Especially, the sampling circuit is arranged to sample a first input voltage across the first capacitor component, and a second input voltage across the second capacitor component, and to generate the digital signal output accordingly. Especially, the power converter may comprise a third capacitor component with a fixed capacitance, and wherein the first and third capacitor components are connected in series between the two external electric terminals.

The capacitor device may especially be designed to handle an electric power of at least 1 kW, e.g. 10-100 kW or even 1 MW or more, and/or arranged to handle a voltage of at least 100 V across the two external electric terminals. In other embodiments, the inductor device may be arranged for low power applications, e.g. in LED driver electronics etc.

It is to be understood that the capacitor device can be arranged to operate with an AC or a DC electric signal at the two external electric terminals. For both AC and DC, the hardware is the same, but in the algorithm, at least a bandpass filter should be adapted accordingly, namely to provide DC component extraction for DC capacitor, while fundamental frequency component extraction for AC capacitor.

The processor and associated components of the processor system may be selected as components known by the skilled person, as mentioned either in a digital version or an analog version. Especially, the processor may be a digital microprocessor with digital memory and a sampling system with an analog-to-digital converter, such as known in the art. Likewise, a gatedriver circuit suited to drive the switches of the power converter based on a digital input is also known in the art.

In a second aspect, the invention provides a power electric circuit comprising a capacitor device according to the first aspect. Especially, such power electric circuit may be a power converter or a rectifier. However, in general, the capacitor device can be used in a large variety of circuit, including high power circuits handling 1-100 kW or even up to several MW.

In a third aspect, the invention provides a method for providing a controllable electric capacitance value, the method comprising receiving an input indicative of a capacitance value,
providing an enclosure,
providing a power converter comprising a plurality of interconnected controllable electric switches,
providing a first capacitor component with a fixed capacitance, and being electrically connected to the power converter,
providing two external electric terminals arranged to be externally accessible from outside the enclosure, wherein at least one of the two external electric terminals is connected to the first capacitor component and the power converter, and
sensing at least one input voltage related to one of the two external electric terminals and the first capacitor component, and
executing an algorithm configured to generate a control signal to control the power converter in response to said sensed at least one input voltage, so as to provide a resulting electric capacitance between the two external electric terminals which corresponds to the controllable electric capacitance value input.

It is to be understood that the same advantages and preferred embodiments and features apply for the second and third aspects, as described for the first aspect, and the aspects may be mixed in any way.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

Figure 1:
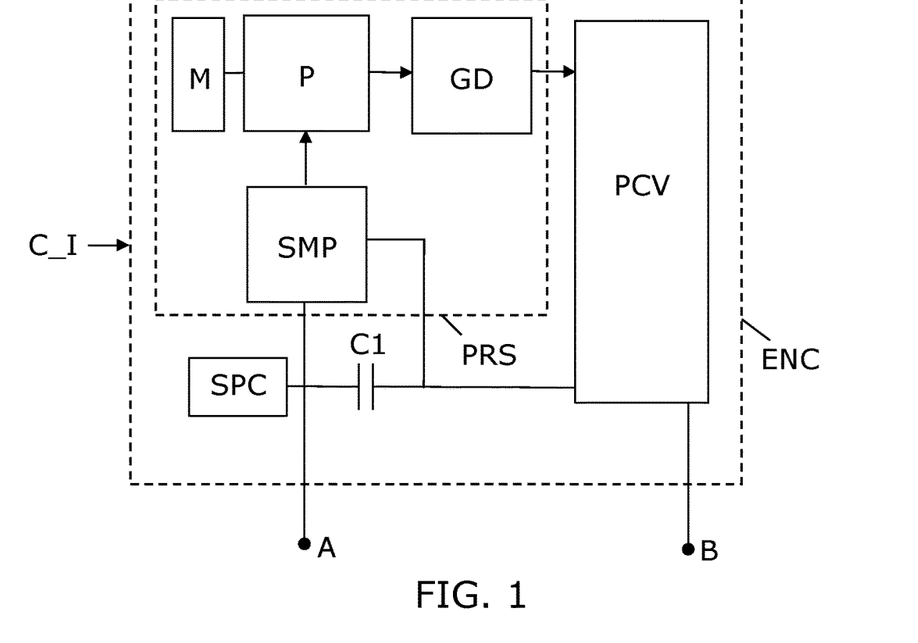
FIG. 1 illustrates a block diagram of a capacitor device embodiment.

FIG. 1 illustrates a block diagram of a capacitor device embodiment which is arranged to receive a controllable electric capacitance value input C_I. The device is arranged to provide a resulting electric capacitance between the two external electric terminals A, B, such that the resulting capacitance corresponds to the controllable electric capacitance value input C_I.

In the shown embodiments, the enclosure ENC houses all of: a processor circuit PRS, a power converter PCV with a plurality of interconnected controllable electric switches, a first capacitor component C1 with fixed capacitance, and a self powering circuit SPC serving to provide power to all the electric power demanding components inside the enclosure ENC based on input from the external terminals A, B, either in a direct or in an indirect manner. Hereby, an active two-terminal capacitor device is provided which allows its capacitance to be adjusted in response to the capacitance value input C_I.

As seen, the power converter has four controllable electric switches in a H bridge configuration, the fixed capacitor component C1, are connected in series between the two external electric terminals A, B. Further the self powering circuit SPC is also connected to at least one of the terminals A, B or in other ways connected directly or indirectly to the terminals A, B. In the shown embodiment, the processor system comprises a digital microprocessor P with an associated memory M in which the control algorithm is stored. As an example, a sampling circuit SMP may serve to sample a voltage across the fixed capacitor component C1 and to generate a digital signal output to the microprocessor P accordingly. The sampling circuit may sample one or two further voltages to be included in the digital signal output to the microprocessor P. The microprocessor is configured to execute the control algorithm stored in the memory M. The control algorithm is configured to generate a control signal to control the power converter PCV in response to the digital signal output from the sampling circuit SMP, so as to provide a resulting electric capacitance between the two external electric terminals A, B. A gate driver circuit GD is arranged to control the plurality of controllable electric switches SWC of the power converter PCV in response to the control signal from the processor P.

In preferred embodiments, the control algorithm in memory M involves a coefficient which can be adjusted in response to the capacitance value input C_I, so as to allow the resulting electric capacitance between the two external electric terminals to reflect the capacitance value input C_I.

In this manner, an active two-terminal capacitor with adjustable capacitance can be implemented.

The connection of the self powering circuit SPC can be implemented in different ways, where the electric power comes directly or indirectly from the external terminals A, B. In some embodiments, the self powering circuit SPC may be connected to two power terminals of one of the controllable electric switches in the power converter PCV, or in other embodiments, the self powering circuit is connected to a capacitor component, and in yet other embodiments the self powering circuit is connected directly to the external terminals A, B. Still other ways of connecting a self powering circuit are possible by connection via other components of the device to indirectly obtain power from the terminals A, B.

The invention is based on the insight, that the processor system and algorithm allows a resulting capacitance which is higher and more stable than with a traditional capacitor component with the same dimensions. In addition, the capacitance value input C_I allows the capacitor device to have a programmable capacitance. This can be used in various applications to provide one piece of hardware which can be programmed to a desired capacitance value after manufacturing, or it can be used to provide a user programmable capacitor, or even a capacitor which can adjust its capacitance on-line in response to e.g. a voltage related its external electric terminals A, B.

Figure 2:
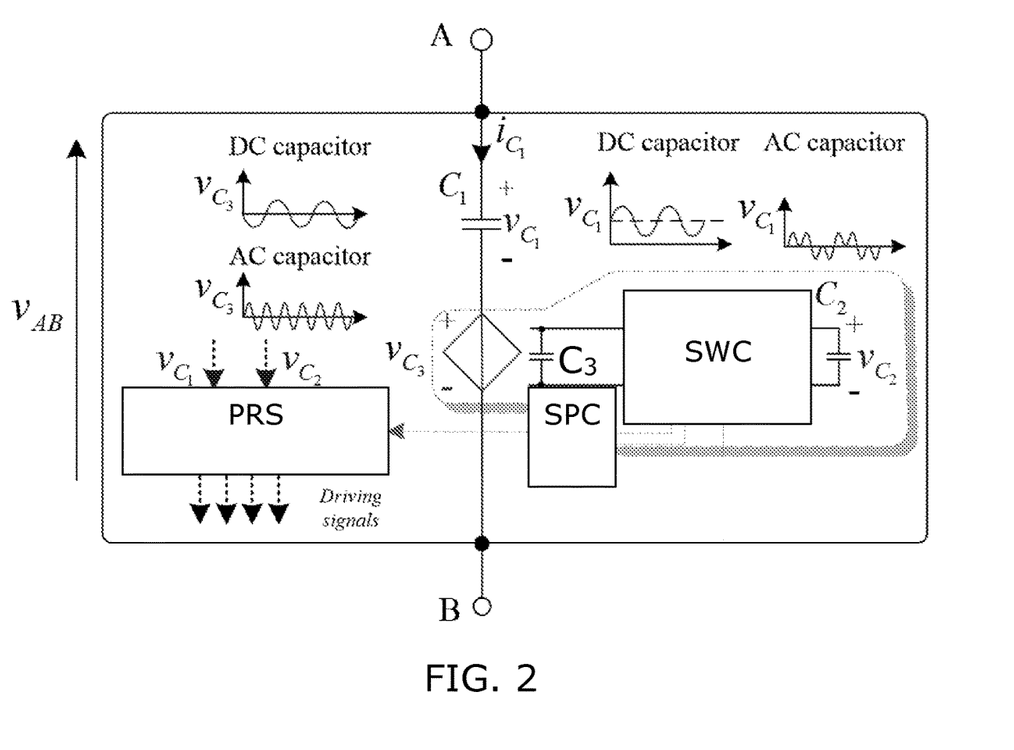
FIG. 2 illustrates another block diagram of a capacitor device embodiment.

FIG. 2 shows an embodiment with more details. In this embodiment, the power converter comprises a second capacitor component C2, and a third capacitor C3 component, both with the fixed capaticances. The first and third capacitors C1, C3 are seen to be connected in series between the two external electric terminals A, B. The switching circuit SWC with controllable electric switches is connected across the third capacitor C3. The second capacitor C2 is connected one the opposite side of the switching circuit SWC than the third capacitor.

The processor system PRS samples two voltages: the voltage VC1 across the first capacitor C1, and the voltage VC2 across the second C2, and these voltages VC1, VC2 are then used in the control algorithm in the processor system PRS to generate driving signals to control the controllable electric switches if the switching circuit SWC. Graphs are used to indicate voltages across C1 and C3 in case of these being either AC or DC capacitors.

Figure 3A:
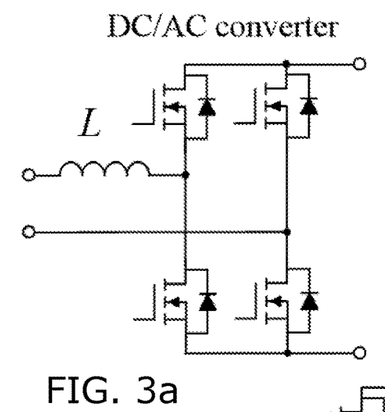
FIGS. 3*a*, 3*b*, and 3*c* illustrate power converter circuit examples.
Figure 3B:
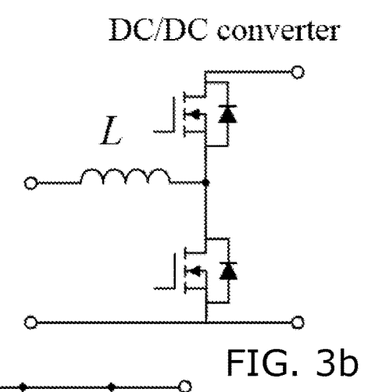
Figure 3C:
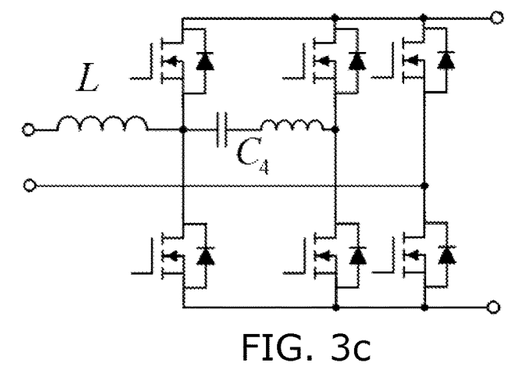

FIGS. 3a-3c illustrate different possible implementations of the switching circuit SWC of the power converter PCV, namely using four, two or six switches. The power converter PCV can be either DC/AC or DC/DC converters.

Figure 4A:
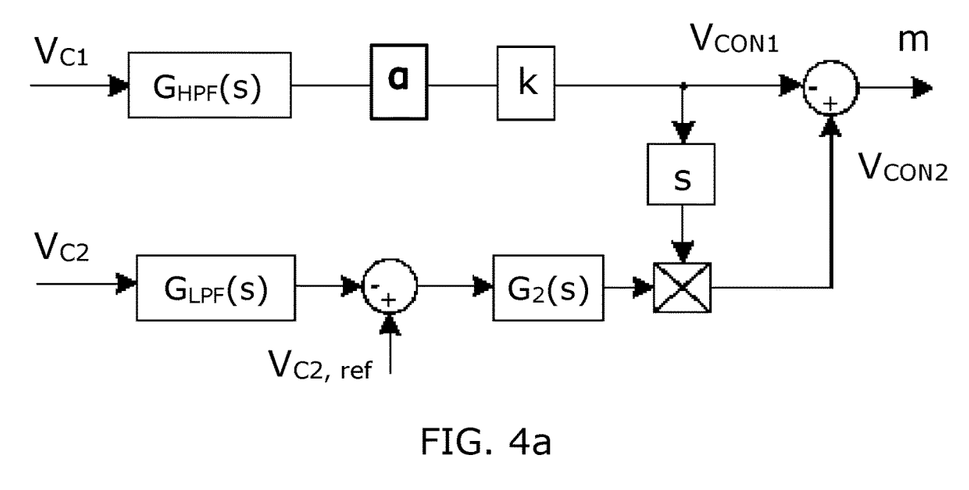
FIGS. 4*a* and 4*b* illustrate an example of an algorithm with an adjustable coefficient k and a graph showing relation between k and the resulting capacitance.

FIG. 4a illustrates an example of an algorithm embodiment, taking voltages VC1, VC2 as inputs, as illustrates in FIG. 2. Vcon1 is the control signal related to the equivalent capacitance, which is obtained from the harmonics of VC1 extracted through the high pass filter HPF and the coefficient k. The resulting capacitance is adjustable based on the coefficient k in this algorithm, and thus k can be changed in response to the capacitance value input C_I in order to allow the capacitance value input C_I to adjust the resulting capacitance. The scaling factor α is the ratio between the conditioned feedback signal from the voltage across the capacitor component C1 and VC1. Vcon2 is the control signal related to the power loss compensation within the enclosure ENC, which is obtained from closed-loop control of the DC component of VC2.

Figure 4B:
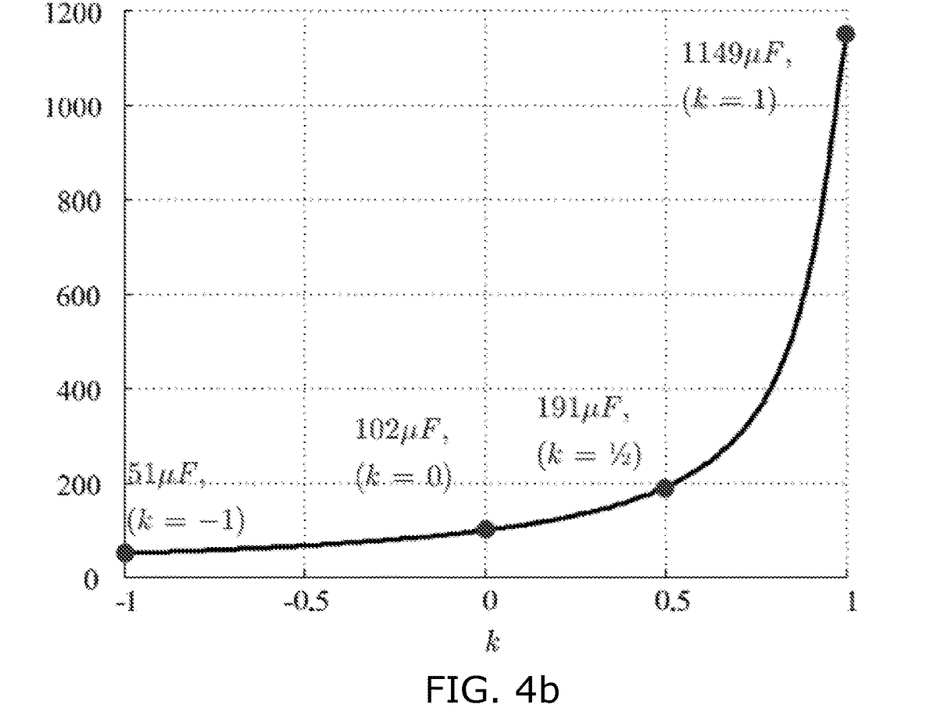

FIG. 4b shows a graph serving to illustrate, for a specific implementation example, the relation between the variable coefficient k, and the resulting capacitance in µF. As seen, there is a highly non-linear translation between the coefficient k and the resulting capacitance. This need to be compensated for, in order to translate a capacitance value input C_I to a coefficient k that will result in a matching resulting capacitance.

Figure 5A:
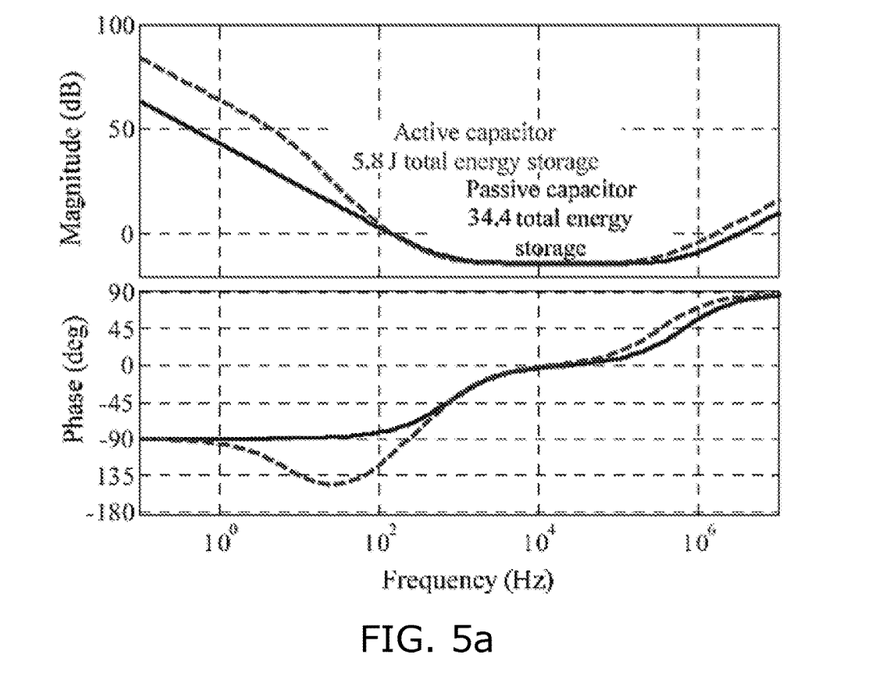
FIGS. 5*a* and 5*b* illustrate graphs indicating performance of a specific embodiment.

FIG. 5a shows, for a specific example, graphs indicating impedance matching between a specific implementation of the capacitor device (dashed line) and a passive capacitor component with fixed capacitance, in terms of magnitude and phase as a function of frequency. As seen, at least in the frequency range 100 Hz to 100 kHz, there is a good impedance match.

Figure 5B:
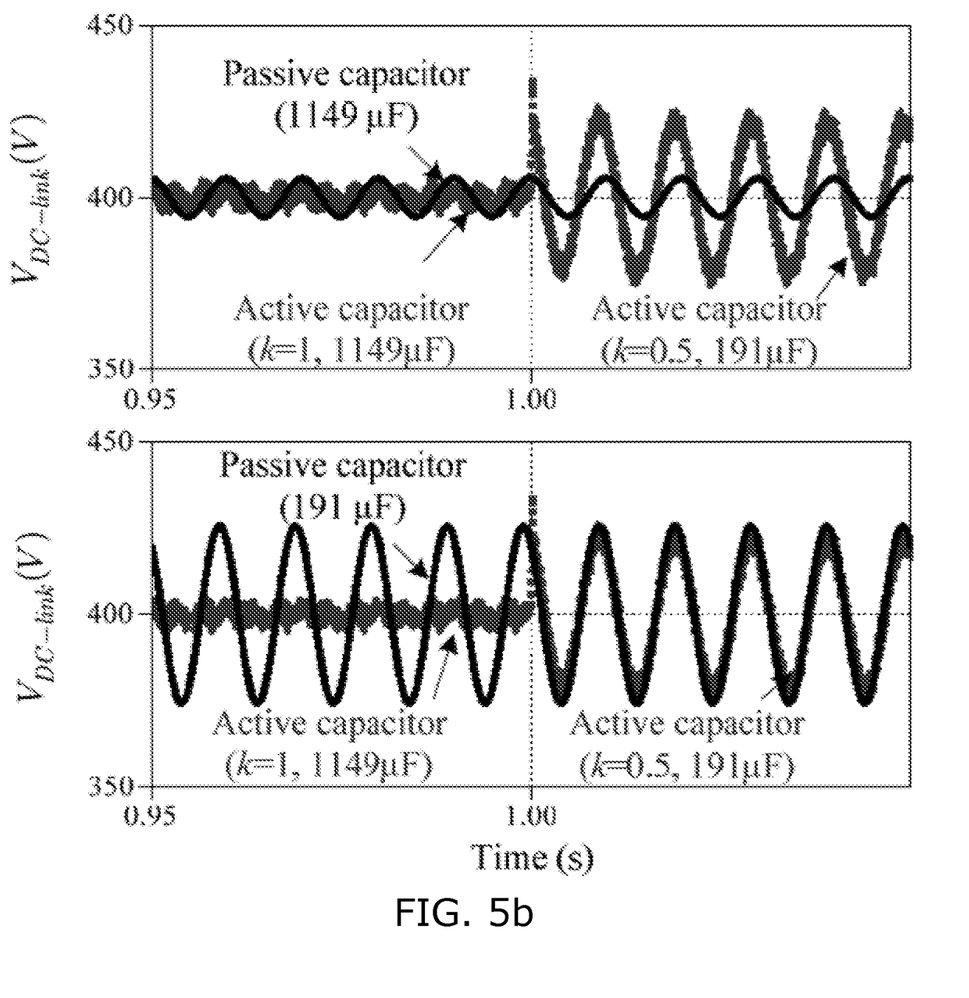

FIG. 5b show graphs indicating simulated results for voltages across the capacitor device (active capacitor), and a passive capacitor, as a function of time. As indicated, with the same capacitor device hardware, it is possible to vary the resulting capacitance between 191-1149 µF. This indicates, that it is possible to manufacture one hardware component and program the capacitor device with the desired capacitance value input C_I to obtain resulting capacitances over a wide capacitance range.

Figure 6:
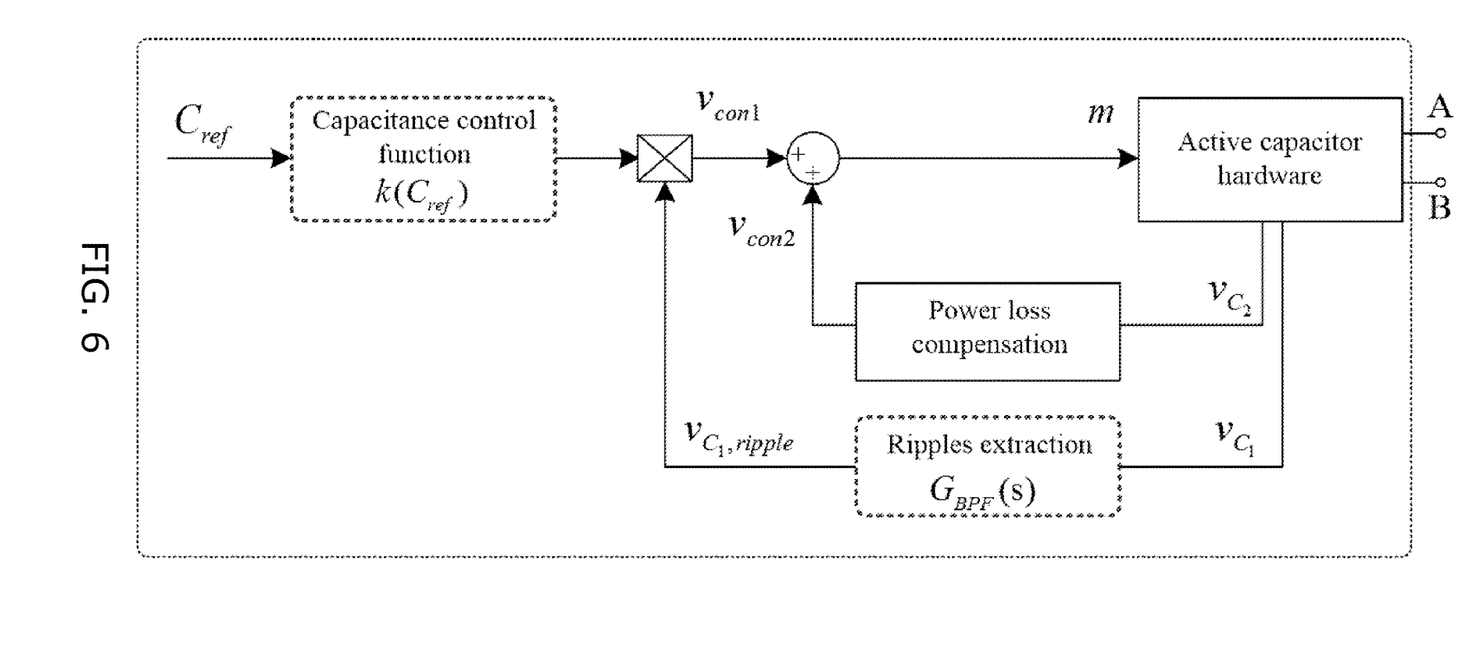
FIG. 6 shows an example of an algorithm with implementation of the capacitance value input as a fixed value.

FIG. 6 shows another algorithm embodiment, also based on the voltage inputs VC1, VC2. Here, the capacitance value input Cref is applied to a capacitance control function which is:

$$k = \frac{V_{tric}(M^2 C_1 + C_2)}{aC_2 V_{C_2} G_{BPF}(s)} - \frac{V_{tric}C_1}{aV_{C_2} G_{BPF}(s)C_{ref}}$$

Here, M is the modulation index which is the maximum of m in FIG. 4a and Vtric is the amplitude of the PWM triangular signal. The ratio a is the ratio between the conditioned feedback signal from the voltage across capacitor component C2 and VC2.

The control signal of the variable active capacitor contains two parts, Vcon1 and Vcon2. Vcon1 is used for capacitance programming and Vcon2 is used for internal power loss compensation to compensate for power loss in the hardware. The control block diagram does not specify the location of the feedback Vcon1 for capacitance programming, since it can be implemented in different ways.

Further, a ripple extraction is used to extract ripple from either DC or AC signals. The active capacitor hardware is understood to be processor system PRS hardware, the power converter PCV and the fixed capacitor component C1.

Figure 7:
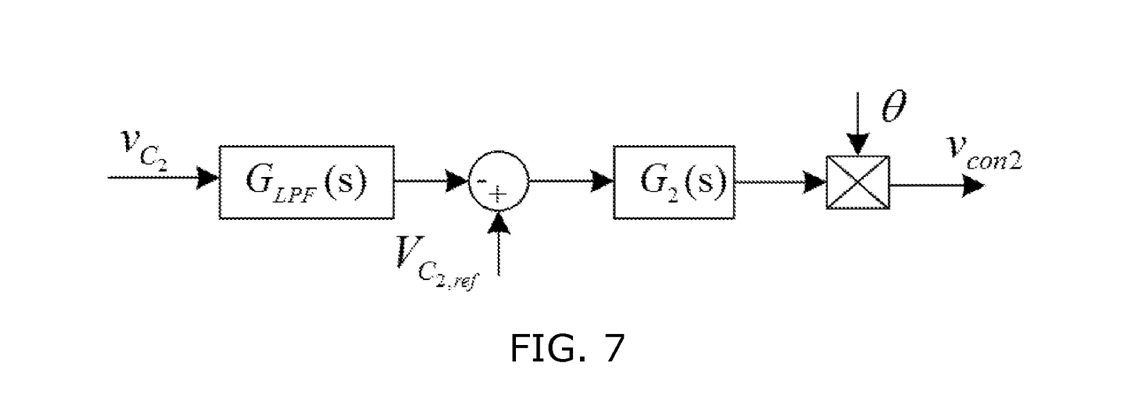
FIG. 7 illustrates an example of a power loss compensation algorithm.

FIG. 7 illustrates a specific example of the mentioned power loss compensation algorithm part.

Figure 8:
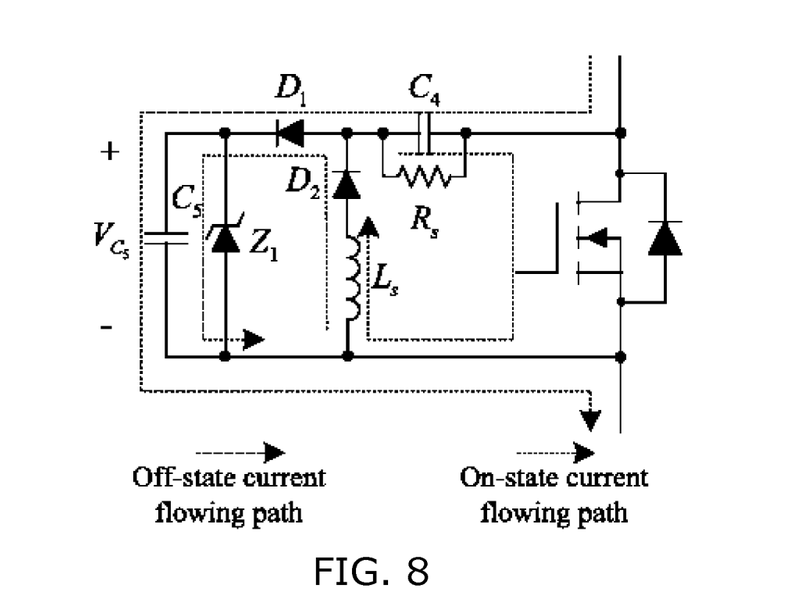
FIG. 8 illustrates an example of a self powering circuit.

FIG. 8 indicates a specific example of a self powering circuit SPC serving to provide power to all power demanding circuits of the capacitor device based on electric input from the external electric terminals A, B. Here the self powering circuit SPC is implemented as a circuit to be connected to two power terminals of one of the controllable electric switches in the power converter, e.g. the two power terminals of an MOSFET.

Figure 9:
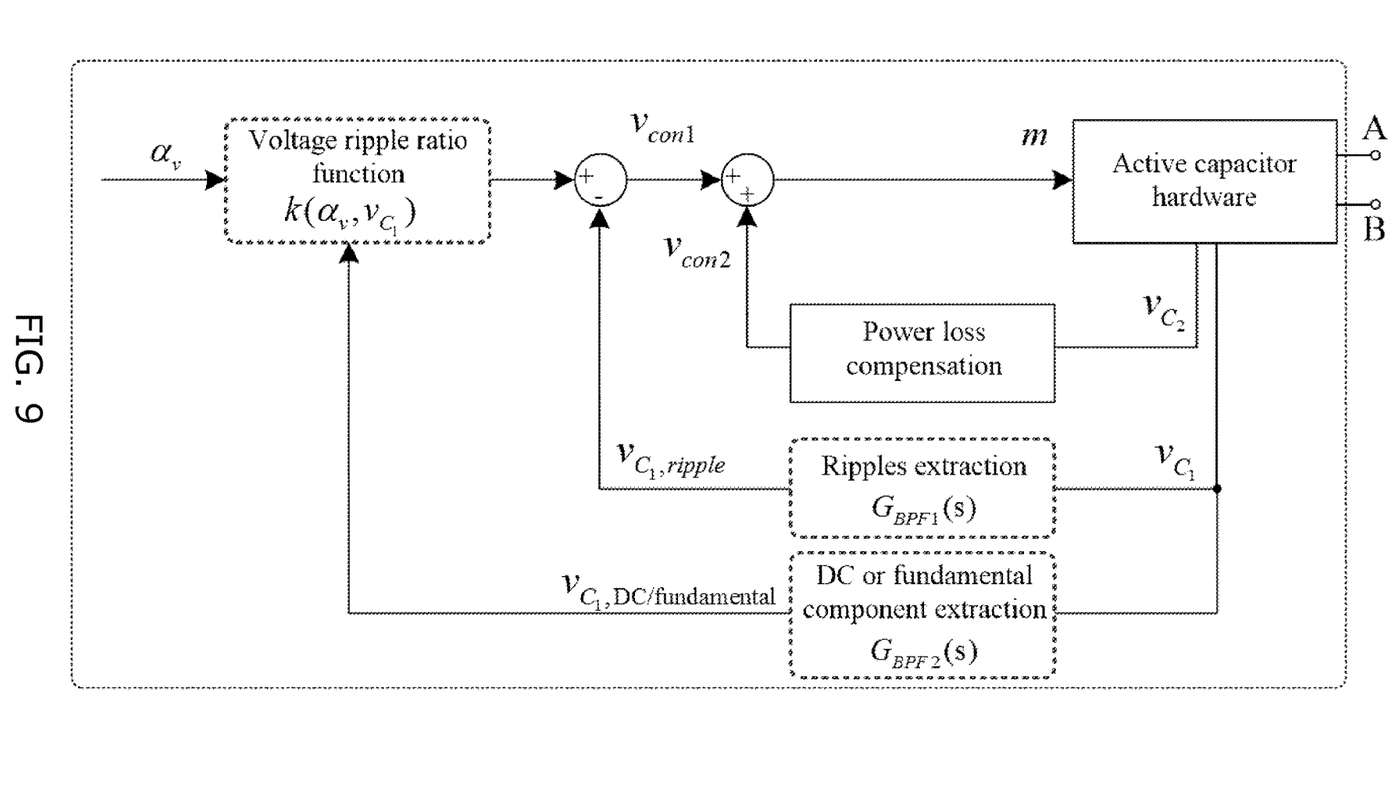
FIG. 9 shows an example of an algorithm with on-line variable capacitance.

FIG. 9 illustrates an algorithm embodiment where the resulting capacitance is on-line adjustable during normal operation, e.g. adaptive with load condition for a specified voltage ripple ratio. For example, when the load increases, if the capacitance is constant, the ripple will be larger. However, with the variable capacitor device, the capacitance will be adaptive with the load to be larger, in order to keep the same voltage ripple ratio for different loads. Still, as seen, this algorithm is based on the two voltages VC1, VC2 as input.

The voltage ripple ratio function is:

$$k = a_v v_{C_1, DC/fundamental}$$

Reference is made here also to the formula given above in relation to FIG. 6.

Figure 10:
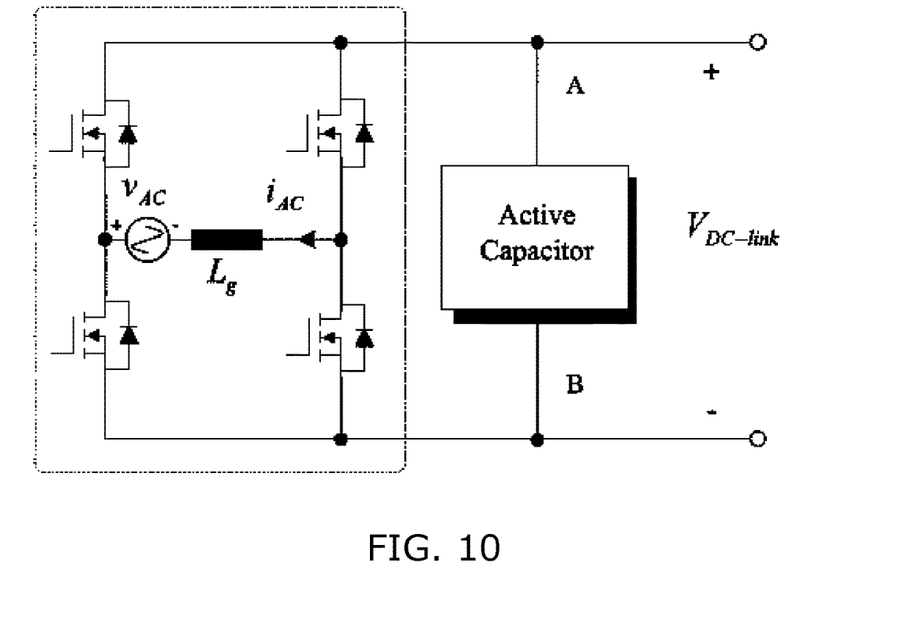
FIG. 10 illustrates a rectifier circuit application where the capacitor device of the invention is used.

FIG. 10 shows a specific example of a single phase rectifier circuit in which the capacitor device (Active Capacitor) is used as the DC link.

Figure 11:
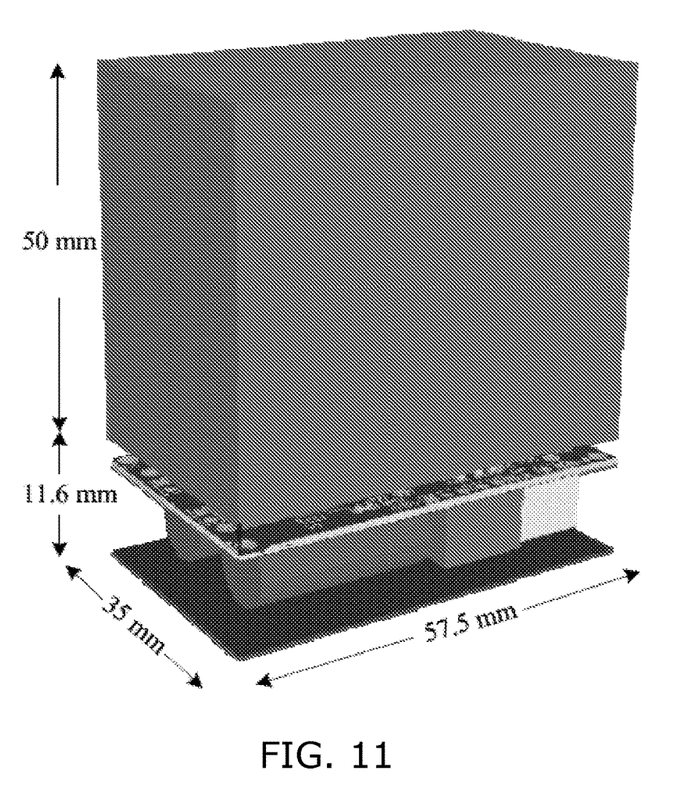
FIG. 11 illustrates an example of dimensions of a capacitor device embodiment and a traditional capacitor component with only a tenth of the capacitance.

FIG. 11 shows an illustration of a bulky 50 mm high box shaped passive capacitor component (top), together with a PCB with hardware components (bottom) with the same basic area, but almost only ⅕ of the height of the capacitor component. Still, the capacitor device can provide an electric capacitance value as high as a factor of 10 of the passive capacitor component.

Figure 12:
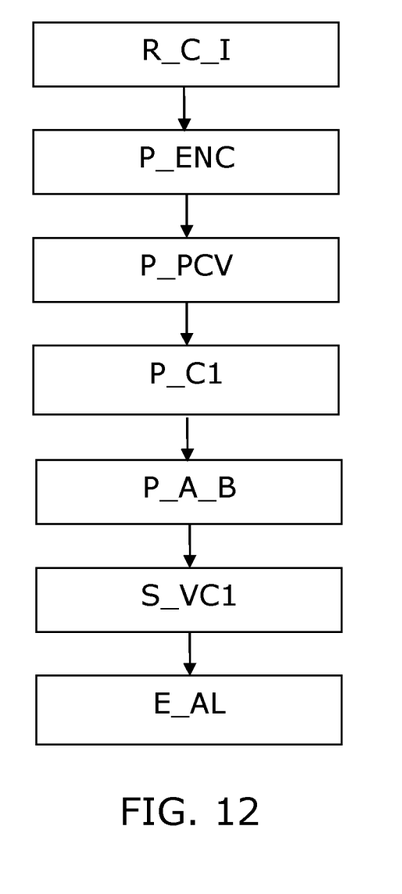
FIG. 12 illustrates steps of a method embodiment.

FIG. 12 illustrates steps of an embodiment of a method for providing a controllable electric capacitance value. The method comprises receiving R_C_I an input indicative of a capacitance value, e.g. a desired capacitance input by a user. The method comprises providing P_ENC an enclosure, providing P_PCV a power converter comprising a plurality of interconnected controllable electric switches, providing P_C1 a first capacitor component with a fixed capacitance, and being electrically connected to the power converter, providing P_A_B two external electric terminals arranged to be externally accessible from outside the enclosure, wherein at least one of the two external electric terminals is connected to the first capacitor component and the power converter. With these hardware components, the method further comprises sampling S_VC1 at least one input voltage related to one of the two external electric terminals and the first capacitor component, and executing E_AL an algorithm, preferably on a processor system, wherein the algorithm is configured to generate a control signal to control the power converter in response to said sampled at least one input voltage, so as to provide a resulting electric capacitance between the two external electric terminals which corresponds to the controllable electric capacitance value input.

In general, the capacitor device according to the invention is useful for power circuit designs within a wide range of applications, such as within renewable energy. Specific application examples are: wind turbine power converters, photovoltaic inverters, DC-links of modular multi-level converters in High-Voltage Direct Current (HVDC), and motor drive DC-links.

To sum up: the invention provides an active two-terminal capacitor device with a controllable capacitance based on a capacitance value input C_I. A processor system PRS executes an algorithm which controls a power converter PCV with controllable electric switches connected to the two external terminals A, B along with a fixed value capacitor component C1. Based on sampling of at least the voltage across the capacitor component C1, the algorithm controls the power converter PCV to provide a resulting capacitance across the external terminals A, B which serves to match the capacitance value input C_I.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A capacitor device with a controllable electric capacitance value input (C_I), comprising:
   an enclosure (ENC),
   a power converter (PCV) comprising a plurality of interconnected controllable electric switches (SWC),
   a first capacitor component (C1) with a fixed capacitance, and being electrically connected to the power converter (PCV),
   two external electric terminals (A, B) arranged to be externally accessible from outside the enclosure (ENC), wherein at least one of the two external electric terminals (A, B) are connected to the first capacitor component (C1) and the power converter (PCV), and
   a processor system (PRS) comprising:
      a processor; and
      memory storing instructions that, when executed by the processor, causes the processor system (PRS) to:
         receive a digital signal output, that is generated based on at least one input voltage (VC1, VC2) related to one of the two external electric terminals (A, B) and the first capacitor component (C1),
         generate, based on the received digital signal output, a control signal to control the power converter (PCV), so as to provide a resulting electric capacitance between the two external electric terminals (A, B) which corresponds to the controllable electric capacitance value input (C_I).

2. The capacitor device according to claim 1, wherein the processor system (PRS) further comprises:
   a sampling circuit (SMP) arranged to sample said at least one input voltage (VC1, VC2) and to generate the digital signal output accordingly, and
   a gate driver circuit (GD) arranged to control the plurality of controllable electric switches (SWC) in response to the control signal from the processor (P).

3. The capacitor device according to claim 1, wherein the processor system (PRS) comprises an analog controller, wherein the receiving and the generating are performed by an analog electronic circuit.

4. The capacitor device according to claim 1, wherein the enclosure (ENC) is configured for housing the first capacitor component (C1), the power converter (PCV), and the processor system (PRS).

5. The capacitor device according to claim 1, wherein the power converter (PCV), and the processor system (PRS) are arranged inside a resin or a gel and positioned within a housing of the first capacitor component (C1).

6. The capacitor device according to claim 1, comprising a self powering circuit (SPC) connected to receive electric power from the two external electric terminals (A, B) in a direct or indirect manner, and to convert said electric power for powering the power converter, and the processor system.

7. The capacitor device according to claim 1, wherein the processor system (PRS), the power converter (PCV), and the first capacitor component (C1) are arranged on one single Printed Circuit Board.

8. The capacitor device according to claim 1, configured to receive the controllable electric capacitance value input (C_I) into said memory (M).

9. The capacitor device according to claim 8, wherein the instructions, when executed by the processor, further cause the processor system (PRS) to:
  adjust an adjustable coefficient (k) in response to the capacitance value input (C_I).

10. The capacitor device according to claim 8, configured to receive the controllable electric capacitance value input (C_I) into said memory from outside the enclosure.

11. The capacitor device according to claim 10, wherein the memory (M) is programmable from outside the enclosure by means of at least one externally accessible electric terminal.

12. The capacitor device according to claim 10, wherein the memory (M) is programmable from outside the enclosure by means of a wireless interface.

13. The capacitor device according to claim 8, configured to receive the controllable electric capacitance value input (C_I) by means of a pre-programmed Read Only Memory type memory (M) which at least contains a preprogrammed code indicative of the controllable electric capacitance value input (C_I).

14. The capacitor device according to claim 1, configured to receive the controllable electric capacitance value input (C_I) by means of an adjustable device with a plurality of different settings which can be read by the processor (P).

15. The capacitor device according to claim 1, further comprising:
  a sampling circuit that is arranged to sample a voltage, and to generate the digital signal output to the processor (P) accordingly.

16. The capacitor device according to claim 1, being arranged to provide a controllable electric capacitance value which is at least a factor of 2 higher than an electric capacitance of the electric capacitor component (C1).

17. The capacitor device according to claim 1, wherein the capacitor component (C1) is an electrolytic type capacitor, a film type capacitor or a ceramic type capacitor.

18. The capacitor device according to claim 1, wherein the power converter (PCV) comprises a plurality of controllable electric switches that are connected in a full bridge configuration.

19. The capacitor device according to claim 1, wherein the power converter comprises a second capacitor component (C2) with a fixed capacitance.

20. The capacitor device according to claim 19, further comprising:
  a sampling circuit (SC) that is arranged to sample a first input voltage (VC1) across the first capacitor component (C1), and a second input voltage (VC2) across the second capacitor component (C2), and to generate the digital signal output accordingly.

21. The capacitor device according to claim 19, further comprising a third capacitor component (C3) with a fixed capacitance, and wherein the first and third capacitor components (C1, C3) are connected in series between the two external electric terminals (A, B).

22. The capacitor device according to claim 1, arranged to handle an electric power of at least 1 kW, or arranged to handle a voltage of at least 100 V across the two external electric terminals (A, B).

23. The capacitor device according to claim 1, arranged to operate with an AC electric signal at the two external electric terminals (A, B).

24. The capacitor device according to claim 1, arranged to operate with a DC electric signal at the two external electric terminals (A, B).

25. A power electric circuit comprising a capacitor device according to claim 1.

26. A method for providing a controllable electric capacitance value (C), the method comprising
  receiving (R_C_I) an input indicative of a capacitance value,
  providing (P_ENC) an enclosure,
  providing (P_PCV) a power converter comprising a plurality of interconnected controllable electric switches,
  providing (P_C1) a first capacitor component with a fixed capacitance, and being electrically connected to the power converter,
  providing (P_A_B) two external electric terminals arranged to be externally accessible from outside the enclosure, wherein at least one of the two external electric terminals is connected to the first capacitor component and the power converter, and
  receiving a digital signal output, that is generated based on at least one input voltage related to one of the two external electric terminals and the first capacitor component, and
  generating, based on the received digital signal output, a control signal to control the power converter so as to provide a resulting electric capacitance between the two external electric terminals which corresponds to the controllable electric capacitance value input.

* * * * *